(12) United States Patent
Dupuis et al.

(10) Patent No.: US 7,375,529 B2
(45) Date of Patent: May 20, 2008

(54) INDUCTION MAGNETOMETER

(75) Inventors: Jerome Christian Dupuis, Fredericton (CA); Bruce Gordon Colpitts, Fredericton (CA); Brent Robert Petersen, Fredericton (CA)

(73) Assignee: University of New Brunswick, Fredericton, New Brunswick (CA)

( * ) Notice: Subject to any disclaimer, the term of this patent is extended or adjusted under 35 U.S.C. 154(b) by 230 days.

(21) Appl. No.: 10/996,443

(22) Filed: Nov. 26, 2004

(65) Prior Publication Data

US 2005/0156601 A1 Jul. 21, 2005

(51) Int. Cl.
*G01V 3/16* (2006.01)
*G01R 33/02* (2006.01)

(52) U.S. Cl. .................. 324/331; 324/244; 324/247

(58) Field of Classification Search ................ 324/326, 324/327, 330, 331, 332, 334, 337, 344, 345, 324/244, 247, 253–255; 33/355 R, 361, 33/363 Q; 343/705, 707
See application file for complete search history.

(56) References Cited

U.S. PATENT DOCUMENTS

| | | | | | |
|---|---|---|---|---|---|
| 2,403,347 | A | * | 7/1946 | Depp et al. | 324/253 |
| 2,485,931 | A | * | 10/1949 | Slonczewski | 324/247 |
| 2,597,125 | A | * | 5/1952 | Noxon | 33/319 |
| 2,710,942 | A | * | 6/1955 | Emerson | 324/247 |
| 3,133,244 | A | * | 5/1964 | Wojtulewicz | 324/247 |
| 3,163,944 | A | * | 1/1965 | Whitcomb | 111/101 |
| 3,694,793 | A | * | 9/1972 | Concelman | 439/358 |
| 3,890,565 | A | * | 6/1975 | Obenschain | 324/202 |
| 4,462,165 | A | * | 7/1984 | Lewis | 33/361 |
| 4,542,344 | A | * | 9/1985 | Darilek et al. | 324/326 |
| 4,623,842 | A | | 11/1986 | Bell et al. | |
| 5,955,884 | A | | 9/1999 | Payton et al. | |
| 6,154,028 | A | * | 11/2000 | Bushida et al. | 324/253 |
| 6,417,665 | B1 | * | 7/2002 | Scarzello et al. | 324/253 |
| 6,534,983 | B1 | | 3/2003 | Boskamp et al. | |
| 7,057,486 | B2 | * | 6/2006 | Kiko | 336/178 |

OTHER PUBLICATIONS

Peterson, T. S., Calculus with Analytic Geometry, Chapter 20, New York, New York, USA, Harper & Row, Publishers Inc.1960, pp. 391-393.
Becker, A., Design Formulas For Electromagnetic Sensing Coils, Geoexploration, Jan. 1967 pp. 81-88.
Bozorth, R.M. et al., Demagnetizing factors of rods, Journal of Applied Physics, May 1942 vol. 13, pp. 320-326.
Breen, A, Principles in designing instruments for electromagnetic ore prospecting, Geoexploration, 1964, pp. 159-168.
Buselli, G. et al., Robust Statistical methods for reducing sferics noise contaminating transient et al., Geophysics, Nov. 1996, vol. 61, pp. 1633-1646.
Butler, K. et al., Cancellation of multiple harmonic noise series in geophysical records, Geophysics, May-Jun. 2003, pp. 1083-1090.

(Continued)

*Primary Examiner*—Reena Aurora
*Assistant Examiner*—Kenneth J Whittington
(74) *Attorney, Agent, or Firm*—Eugene F. Derenyi (57) ABSTRACT

An array of induction magnetometers for use in airborne transient electromagnetic (ATEM) geophysical exploration is disclosed, having similar weight and external dimensions of prior art induction magnetometers but with improved signal strength, signal-to-noise ratio, higher frequency, self-resonance and bandwidth, and providing accurate and well monitored calibration.

9 Claims, 9 Drawing Sheets

OTHER PUBLICATIONS

CD Technologies, Inductors Application Notes, Apr. 2003.
Chen, Du-Xing, Demagnetizing Factors for Cylinders, IEEE Transactions on Magnetics, vol. 27, No. 4, Jul. 1991, pp. 3601-3619.
Chwala, A., et al., an HTS dc SQUID system et al., Physica C., No. 354, 2001, pp. 45-48.
Clarke, J., Principles and Applications of SQUIDs, Proceedings of the IEEE, vol. 77, No. 8, Aug. 1989, pp. 1208-1223.
Clem, T.R. et al., High-Tc SQUID Gradiometer et al., IEEE Transactions on Applied Superconductivity, vol. 11, No. 1, Mar. 2001, pp. 871-875.
Clem. T.R., Superconducting Magnetic Sensors et al., IEEE Transactions on Applied Superconductivity, vol. 5, No. 2, Jun. 1995, pp. 2124-2128.
Foley, C.P. et al., Geophysical Exploration using Magnetic et al., IEEE Transactions on Applied Superconductivity, vol. 11, No. 1, Mar. 2001, pp. 1375-1378.
Foley, C.P. et al., Field Trials using HTS SQUID et al., IEEE Transactions on Applied Superconductivity, vol. 9, No. 2, Jun. 1999, pp. 3786-3792.
Frandsen A.M.A. et al., OGO Search Coil Magnetometer Experiments, IEEE Transactions on Geoscience Electronics, vol. GE-7, No. 2, Apr. 1969, pp. 61-68.
Green, A.W. et al., Micropulsation Instrumentation Systems at the Dallas Geomagnetic Center, IEEE Transactions on Geoscience Electronics, vol. GE-5, No. 1, Mar. 1967, pp. 3-.
Hauser, J.P., A 20Hz-to-200kHz Magnetic Flux Probe for EMI Surveys, IEEE Transactions on Electromagnetic Compatibility, vol. 32, No. 1, Feb. 1990, pp. 67-69.
Hirota, M. et al., Magnetic Detection of a Surface Ship et al., IEEE Transactions on Applied Superconductivity, vol. 11, No. 1, Mar. 2001, pp. 884-887.
Jaklevic, R.C. et al., Quantum Interference Effects In Josephson Tunneling, vol. 12, No. 7, Feb. 1964, pp. 159-160.
Josephson B.D., Possible New Effects in Superconductive Tunnelling, Physical Review Letters, vol. 12, No. 7, Jul. 1962, pp. 251-253.
Kaplan, B. Z., Treatment of Extremely Low Frequency et al., IEEE Transactions on Magnetics, vol. 34, No. 4, Jul. 1998, pp. 2298-2305.
Kaplan, B.Z., A New Interpretation of the Relationship et al., IEEE Transactions on Magnetics, vol. 30, No. 5, Sep. 1994, pp. 2788-2794.
Kaplan, B.Z. et al., Evaluation of Inductance for Various Distributions et al., IEEE Transactions on Magnetics, vol. 38, No. 1, Jan. 2002, pp. 246-249.
Kepic, A., Sismoelectric Responses from Sulphide Orebodies, Ph.D, Thesis, Dept. of Geophysics and Astronomy, The University of B.C., Sep. 1995, pp. 18-21, 151-158.
Lenz, J.E., A Review of Magnetic Sensors, Proceedings of the IEEE, vol. 78, No. 6, Jun. 1990, pp. 973-989.
Lukoschus, D.G., Optimization Theory for Induction-Coil et al., IEEE Transactions on Geoscience Electronics, vol. GE-17, No. 3, Jul. 1979, pp. 56-63.
Macintyre, S.A. et al., A Portable Low Noise Low Frequency et al., IEEE Transactions on Magnetics, vol. MAG-16, No. 5, Sep. 1980, pp. 761-763.
Maxwell, E.L., Atmospheric noise from 20Hz to 30kHz, Radio Science, vol. 2, No. 3, Jun. 1967, pp. 637-644.
McCracken, K.G. et al., Minimization of noise in electromagnetic exploration systems, Geophysics, vol. 51, No. 3, Mar. 1986, pp. 819-832.
Motchenbacher C.D. et al., Low-Noise Electronic System Design, Toronto, ON, John Wiley & Sons, Inc., 1993, pp. 173-179.
Munkholm, M.S., Motion-induced noise from vibration of a moving TEM et al., Journal of Applied Geophysics, vol. 36, Jan. 1997, pp. 21-29.
Nabighian, M. N., Electromagnetic Methods in Applied Geophysics, Tulsa, Oklahoma, USA, Society of Exploration of Geophysicists, 1988, pp. 233-237.
Panaitov, G. et al., Effect of Repetitive Transmitter et al., IEE Transactions on Applied Superconductivity, vol. 11, No. 1, Mar. 2001, pp. 888-891.
Parasnis, D.S., Principles of Applied Geophysics, Fifth Edition, New York, New York, USA, Chapman & Hall, 1997.
Pozar, D.M., Microwave Engineering, Second Edition, Toronto, Ontario, Canada, John Wlley & Sons, Inc. 1998.
Randa, J. et al., Catalogue of Eletromagnetic et al., IEEE Transactions on Electromagnetic Compatability, vol. 37, No. 1, Feb. 1995, pp. 26-33.
Slemon, G.R., Magnetoelectic Devices, New York, New York, USA, John Wiley & Sons, Inc., 1966.
Stewart, J., Calculus: Early Transcendentals, Third Edition, Scarborough, Ontario, Canada, Brooks/Cole Publishing Company, 1995.
Telford, W.M. et al., Applied Geophysics, Second Edition, Cambridge, UK, Cambridge University Press, 1990.
Watt, A.D., VLF Radio Engineering, Toronto, Ontario, Canada, Pergamon Press, 1967.
Boylestad, R.L., Introductory Circuit Analysis, Toronto, Ontario, Canada, Maxwell Macmillan Canada, Seventh edition, 1994.
Bozorth, R.M. Ferromagnetism, New York, New York, USA, IEEE Press, 1993.
Burrows, M.L., ELF Communications Antennas, Southgate House, Stevenage, Herts, England, Peter Peregrinus Ltd., 1978.
Cheng, D.K., Field and Waves Electronmagnetics, Toronto, Ontario, Canada, Addison-Wesley Publishing Company, 1989.

\* cited by examiner

INDUCTION MAGNETOMETER

CROSS-REFERENCE TO RELATED APPLICATIONS

This application claims priority from Canadian patent application 2,450,837, filed Nov. 25, 2003.

MICROFICHE APPENDIX

Not Applicable.

TECHNICAL FIELD

The present invention relates to magnetometers and more particularly to induction magnetometers for airborne transient electromagnetic geophysical exploration.

BACKGROUND OF THE INVENTION

Airborne Transient ElectroMagnetic (ATEM) methods for geophysical exploration are well known in the art. Such methods are appropriate for finding ore bodies in the ground, especially if large areas are to be explored in remote regions which are not easily accessible from the ground. Certain types of ore bodies are highly conductive compared with their surroundings and are therefore well suited to detection by electromagnetic systems.

New helicopter ATEM systems provide a lower noise platform which can be flown more slowly and at lower altitude than fixed wing aircraft systems and hence can gather higher resolution data. Helicopter systems have restraints such as high flight-time costs. To control such costs, it is advantageous to use smaller helicopters, but smaller helicopters have limited payload capacity. Thus, it is desirable for ATEM sensor systems to be low in weight and sufficiently small, so as to minimize aerodynamic drag. Induction magnetometers in such systems should also have low noise, high sensitivity and large bandwidths.

Most of the early geophysical literature concentrates on air cored induction magnetometers because their performance is easier to predict. Without the flux concentrating effects of a permeable core, these conventional induction magnetometers tend to be awkward to work with because of their size and weight. With the advent of new ferrites and alloys such as MuMetal®, more development of cored induction magnetometers has been undertaken. Cored induction magnetometers have been used in electromagnetic interference measurements, space exploration, extremely low frequency/very low frequency (ELF/VLF) communications and seismo-electric geophysics exploration. Although there is some discussion in the literature in these fields about the related coil design, their optimization parameters usually differ from the objectives of ATEM.

Prior work in geophysical exploration has used arrays of magnetometers in order to speed up data gathering. Magnetometer arrays have also found some use at higher frequencies in magnetic resonance research. Tri-axial magnetometer-accelerometers have been used as gradiometers for sensing magnetic anomalies from a moving platform. The type of sensors used in most of these applications are not of the inductive type and are not suited for use in ATEM.

Figure 1A:
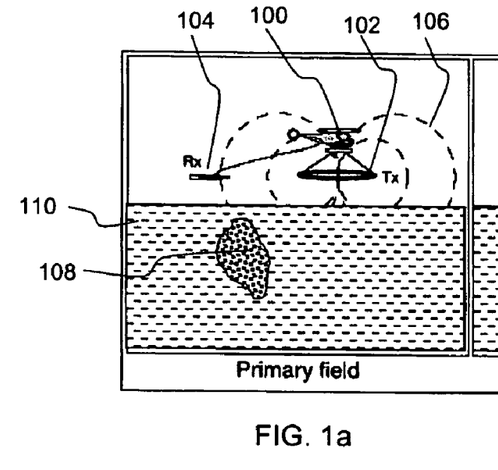
FIG. 1 is a schematic illustration showing a basic ATEM system.
Figure 1B:
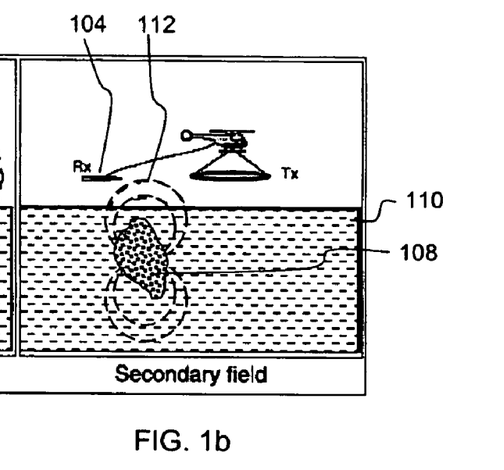

A basic setup of a helicopter-borne ATEM geophysical exploration system is illustrated in FIG. 1. A helicopter 100 carries a horizontal transmitter coil 102 below the helicopter 100, and tows a pod 104 which houses an orthogonal induction magnetometer. The transmitter coil 102 transmits a pulsed primary magnetic field 106. The signal of interest is produced when the transmitter coil 102 makes the transition between the ON state to the OFF state. During this transition, the magnetic field 106 that was applied to a conductor such as an ore body 108 beneath the ground 110, is changing with time and thus a current and a secondary field 112 is created. The current in the ore body 108 usually flows around its perimeter which forms closed contours. After the primary field 106 is turned off, the current in the ore body will decay over time. The decay time will be a function of the ore body's resistivity and inductance. For ore bodies which are good conductors, where the resistance is low, the current will persist for a longer time and thus the secondary field 112 will decay slowly. The inductance is determined by the size of the ore body, thus the larger the ore body deposit, the longer the decay time. For poor conductors, where the resistance is high, the current will decrease rapidly and thus the secondary field 112 will decay much faster. This secondary field is what is measured by the orthogonal induction magnetometer housed in the pod 104.

The system described in FIG. 1 is an example of an induced pulse transient system wherein the primary field is off during the measurement of the secondary field. This type of system has an advantage over the continuous primary field type systems because it avoids the problem of trying to measure a very small secondary field in the presence of a strong continuous primary field. One source of noise in such an ATEM system is from vibration caused by the motion of the sensors relative to the Earth's magnetic field and the secondary field.

For this reason, directional magnetometers are used. These types of magnetometers only respond to flux which is directed along their sensitive axis. By using three orthogonal magnetometers, the orientation of the magnetic field can be resolved, providing important information to geoscientists. This also means that signal processing must be used in order to remove vibration noise.

Figure 2:
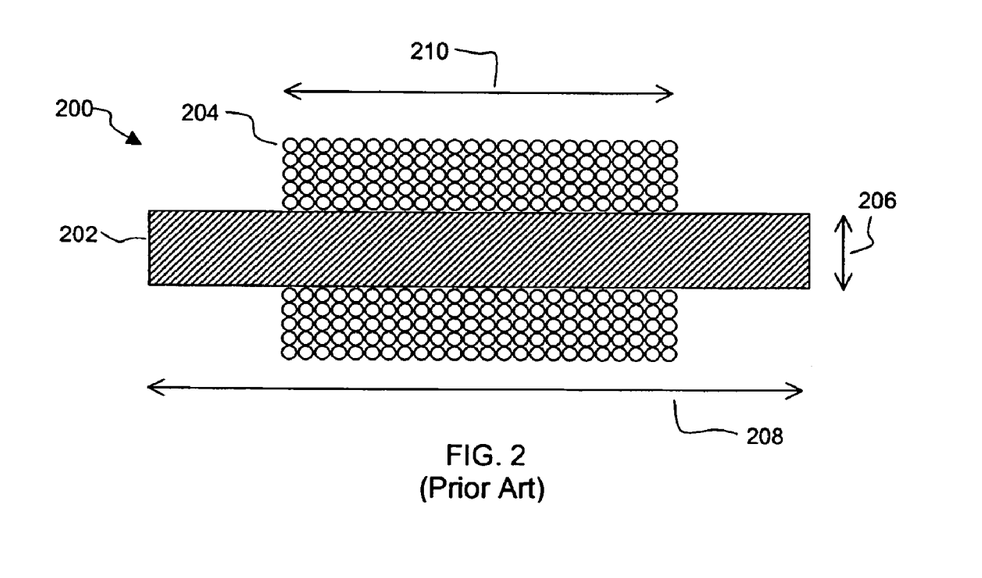
FIG. 2 is a cross-section view of a simple prior art induction magnetometer.

Conventional induction magnetometers (CIM) have long been the sensor of choice for electromagnetic exploration. The design of the CIM is based on Faraday's law of electromagnetic induction which states that the electromotive force induced in a stationary closed circuit is proportional to the product of the number of turns and the negative rate of increase of the magnetic flux linking the circuit. A basic example of a prior art CIM is illustrated in FIG. 2. The CIM indicated generally at 200 consists of a permeable core 202, surrounded by a multi-turn coil 204 of orthogonal windings. The total weight of the CIM 200 is made up of the weight of the core 202 and the weight of the windings of the coil 204. In an ATEM system, it is preferable to minimize the weight and size 206, 208, 210 of the induction magnetometer components. The basic CIM has several limitations. The closely spaced orthogonally-wound windings create capacitance which causes the CIM to self resonate. This resonance limits the usable bandwidth.

In practice, CIMs are usually constructed with scramble-wound coils in order to limit the winding capacitance. This winding technique distributes the turns in a pseudo-random fashion. Layers are not completely filled before proceeding to the next one. Although the spacing introduced decreases the capacitance, it increases the length of wire required to make the same number of turns and thus increases the weight and the resistance of the winding.

An induction magnetometer can be made more sensitive by increasing the magnetic flux captured by the coil and by increasing the number of windings of the coil. Increasing the number of windings in the coil also increases the weight of the coil, which is not desirable for magnetometers used for ATEM. Increasing the magnetic flux captured by a coil can be done by using permeable cores to concentrate the magnetic flux. Larger diameter cores will also capture more flux, but such cores will also be heavier, which is not desirable for magnetometers used for ATEM.

Figure 3:
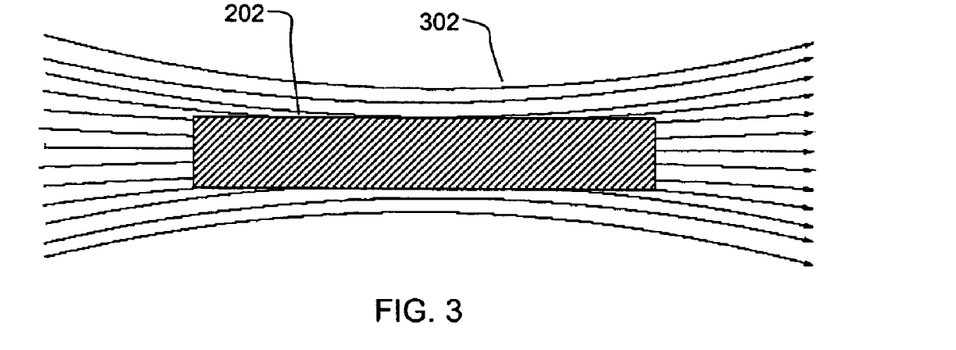
FIG. 3 illustrates representative flux lines in a permeable core.
Figure 4:
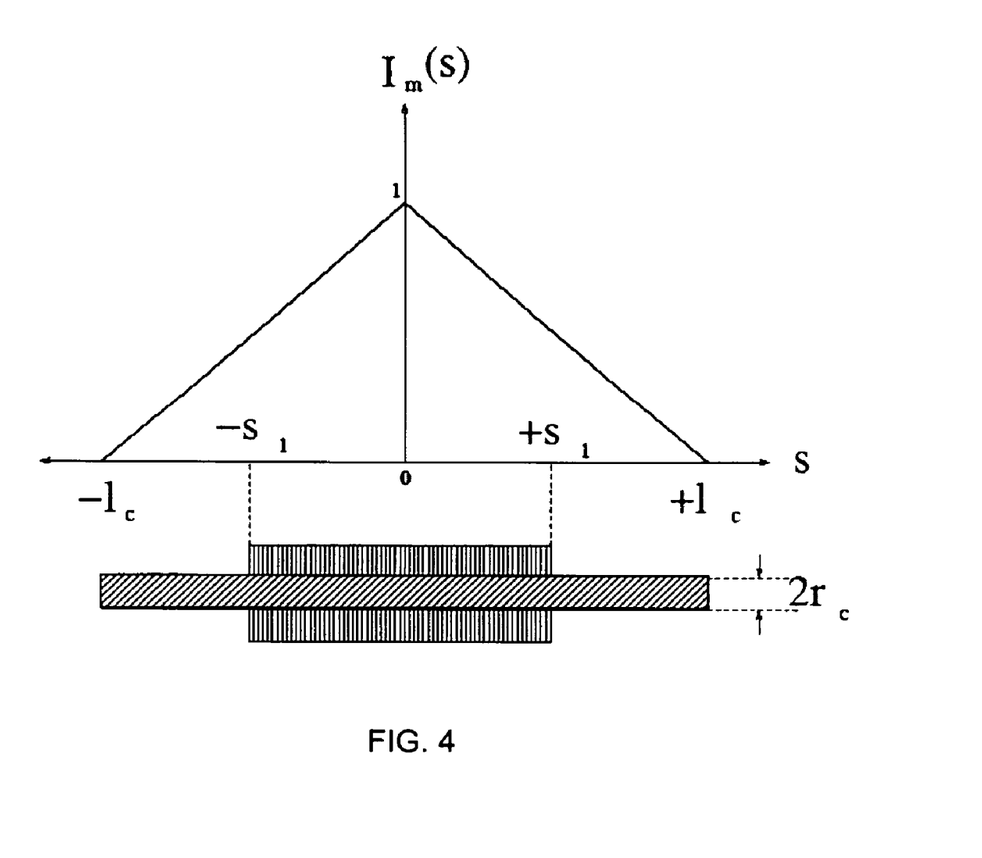
FIG. 4 is a graph of a flux weighting function for a permeable core of an inductor.

Cores with higher permeability will also concentrate more magnetic flux. Finite length permeable rod cores have non-uniform flux along their length. As illustrated in FIG. 3, the variation of the flux within the core 202 is caused by flux lines 302, which do not all enter and exit from the ends of the core. Since the inductance of a CIM is related to the amount of flux which threads the coil, this flux variation has a significant impact on the observed inductance and on the induced voltage of a CIM. The inductance due to windings around a permeable core is therefore dependant on the location of the windings on the core. FIG. 4 illustrates a triangular shape flux weighting function which relates the location of a winding to the output current, and illustrates that windings at the center of a permeable core have more effect than windings near the ends of the core. Also, an induction magnetometer having a longer permeable core will have a higher inductance, and unfortunately, also higher weight and longer length, neither of which are desirable for magnetometers used for ATEM.

Calibration of conventional 3-axis induction magnetometers, also known as orthogonal conventional induction magnetometers (OCIM), usually requires the disassembly of the OCIM. The individual CIMs are brought to a test range where they are placed at a distance from each other. The support for the transmitter loop and the OCIM are checked for orthogonality and the distance between the transmitter and the CIM is measured accurately. This must be done for every CIM which forms the OCIM. This is labor intensive, and time consuming, thus it is generally only done once before every survey. If the system malfunctions during the survey, the reliability of the data is compromised and the survey will have to be re-flown, adding considerable cost.

Accordingly, an improved design of the induction magnetometer, having increased sensitivity, improved signal-to-noise ratio and higher bandwidth, remains highly desirable.

An improved arrangement for calibration of an induction magnetometer for airborne geophysical surveys is also highly desirable.

SUMMARY OF THE INVENTION

It is therefore an advantage of the present invention to provide an improved induction magnetometer for use in airborne geophysical exploration.

Another advantage of the present invention is to provide an improved arrangement for calibration of an induction magnetometer for airborne geophysical surveys.

Briefly, the present invention provides an improvement over known induction magnetometers by using several smaller diameter cores instead of a single larger diameter core. Each smaller diameter core has an increased length-to-diameter ratio which increases the apparent permeability of the cores. The reduction in core cross-sectional area is compensated for by having multiple cores. Spreading the coil windings over several cores, instead of just one, allows for smaller circumference windings over the small diameter cores resulting in less total wire length being required which reduces noise and weight. Multiple smaller coils with fewer windings each also reduces inductance and allows for increased bandwidth.

The configuration of the individual elemental induction magnetometers in a cube arrangement allows for a very compact package, whose symmetry and hollow aspect permits the incorporation of a calibration field source in the center of the package, thus taking up no additional space and allowing for a permanent calibration system which is easy to use and can be used in flight.

An embodiment of the present invention provides an induction magnetometer array for airborne geophysical exploration. The magnetometer array comprises a plurality of elemental induction magnetometers. Each elemental induction magnetometer comprises a permeable core and a multi-turn coil surrounding at least a portion of the core. The cores of the elemental induction magnetometers are arranged such that their longitudinal axes are mutually parallel and the output signals from each elemental induction magnetometer are aggregated.

Another embodiment of the present invention provides an orthogonal induction magnetometer for airborne geophysical exploration. The orthogonal induction magnetometer comprises a plurality of magnetometer arrays. Each magnetometer array comprises a plurality of elemental induction magnetometers. Each elemental induction magnetometer comprises a permeable core and a multi-turn coil surrounding at least a portion of the core. The cores of each array are arranged such that their longitudinal axes are mutually parallel and the output signals from the elemental induction magnetometers are aggregated. The magnetometer arrays are arranged in a mutually orthogonal fashion and the longitudinal axes of the cores correspond to edges of a rectangular parallelepiped.

Another embodiment of the present invention provides an orthogonal induction magnetometer for airborne geophysical exploration. The magnetometer comprises a plurality of magnetometer arrays. Each magnetometer array comprises a plurality of elemental induction magnetometers. Each elemental induction magnetometer comprises a permeable core and a multi-turn coil surrounding at least a portion of the core. The core comprises material having permeability greater than 1000. Each core has a length-to-diameter ratio in a range of 20 to 200. The cores of each array are arranged such that their longitudinal axes are mutually parallel. The output signals from the elemental induction magnetometers are aggregated. The magnetometer arrays are arranged in a mutually orthogonal fashion, and the longitudinal axes of the cores correspond to edges of a rectangular parallelepiped.

Yet another embodiment of the present invention provides a method for designing an optimized induction magnetometer. The method comprises steps of: (1) considering a design of a conventional induction magnetometer comprising a single permeable core having a desired weight and desired length, with a coil surrounding a portion of the core, the coil comprising a desired number of windings; (2) adapting the design of the conventional induction magnetometer by: (a) replacing the single permeable core by a plurality of mutually parallel permeable cores having a total cross-sectional area substantially similar to that of the single permeable core, and having a length substantially similar to that of the single permeable core; (b) redistributing the desired number of windings among said plurality of permeable cores.

BRIEF DESCRIPTION OF THE DRAWINGS

Further features and advantages of the present invention will become apparent from the following detailed description, taken in combination with the appended drawings, in which.

DETAILED DESCRIPTION OF THE PREFERRED EMBODIMENT

Improvements to the design of existing orthogonal induction magnetometers are constrained by certain factors. The ability of the core to concentrate the flux is determined by its apparent permeability. The overall amount of flux which passes through the winding is partially determined by the cross-sectional area of the core. The apparent permeability of the core is strongly influenced by its geometry. The longer the core, the higher the length-to diameter ratio and thus the higher the apparent permeability. In ATEM, the length of the induction magnetometers used is limited by the size of the pod in which it is to be mounted. The pod dimensions are constrained by the payload and aerodynamic drag capacity of the towing helicopter. The core diameter determines the cross-sectional area of the core and the apparent permeability of the core. A decrease in core diameter will increase the apparent permeability of the core but will decease the area of the core. These parameters alone would not allow for very successful optimization of the core since the decrease in area usually outstrips the permeability gains.

Variations in the diameter of the core influence the volume of the core, and therefore its weight. Slender cores of the same length will be lighter and will have higher permeability than stout cores but, unfortunately, they will also have less area. This can be compensated for however. Because slender cores are lighter than stout cores, multiple slender cores can replace a single stout core of the same weight. Thus, multiple slender induction magnetometers or "elemental induction magnetometers" (EIM) can be used to increase the area and permeability while maintaining the same weight as a conventional induction magnetometer. An array of slender induction magnetometers combines high permeability and large total area which sums up to a higher amount of flux being channeled through the windings and larger overall sensitivity. The induced voltages can be combined in series for a higher voltage, or in parallel for higher current.

The increase in sensitivity is not the only advantage of the novel array of elemental induction magnetometers of the present invention. Because the windings are distributed over multiple elemental induction magnetometers, the overall length of wire used in the windings is reduced and the individual number of turns per elemental induction magnetometer is also reduced. Since the overall number of turns remain constant, but the thermal noise attributed to the winding resistance is decreased, the signal-to-noise ratio is increased. Less wire also means less weight and thus an array of elemental induction magnetometers can use heavier gauge wire to reduce thermal noise even further.

Another notable advantage of distributing the windings over multiple elemental induction magnetometers is the decrease in inductance. The inductance of each elemental induction magnetometer can be added algebraically, thus the inductance grows linearly with the addition of EIMs to the array. In comparison, the inductance of a CIM increases by the square of the number of turns. This reduction in inductance is very important because the impedance of an induction magnetometer plays a major role in the noise in the overall instrumentation noise observed. The reduction in inductance allows EIMs to self-resonate at a higher frequency, thus increasing the usable bandwidth such that it is not a limitation in ATEM applications.

Figure 5:
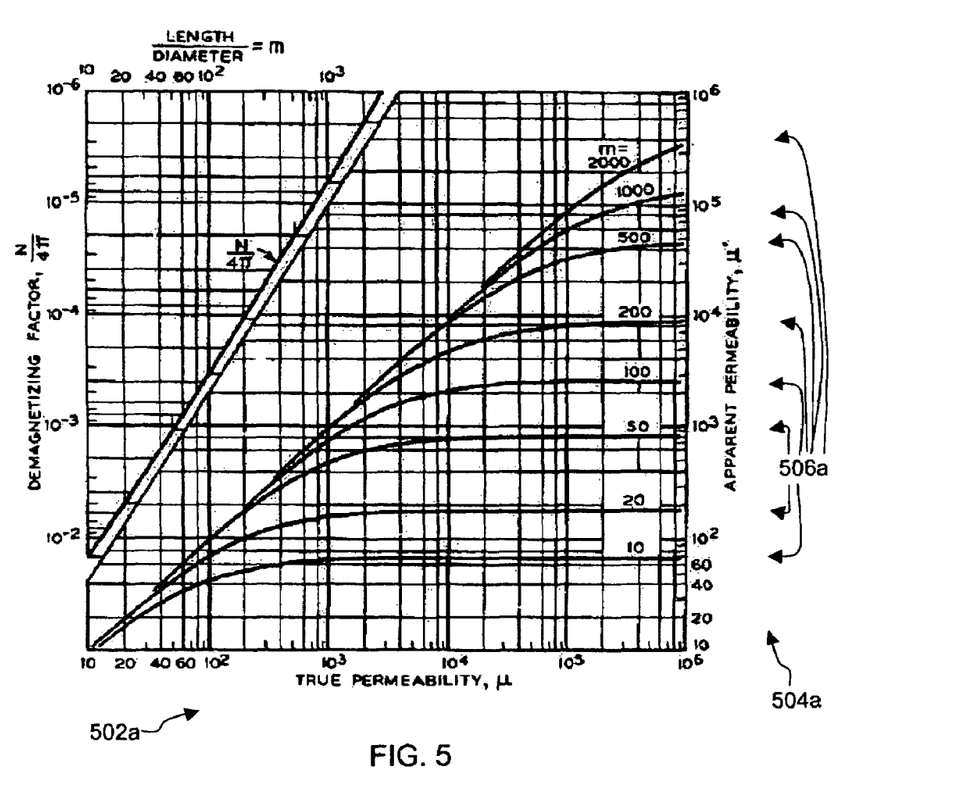
FIG. 5 illustrates the effects of length-to-diameter ratio on apparent permeability of cylindrical cores.

FIG. 5 is a graph illustrating how length-to-diameter ratio affects the apparent permeability of a cylindrical core made of a permeable material having an inherent permeability. The x-axis 502a labeled as the "TRUE Permeability, µ" is in fact the initial or inherent permeability of the material used in the core. The y-axis 504a on the right reveals the apparent permeability that will be observed for the various cylindrical cores. The family of curves 506a traced reveal the attainable apparent permeability given a set initial permeability and the length-to-diameter ratio of the core. The apparent permeability of the core of CIM can either be geometry limited or permeability limited. When the core of a CIM is geometry limited, changing the core material for a core with a higher initial permeability does not give higher apparent permeability. For example, suppose that a core is made of a material with an initial permeability of 1000 and has a length-to-diameter ratio of 10. The graph is read by finding 1000 on the x-axis ("$10^3$") and following the corresponding vertical line to where it intersects the curve for m=10. The apparent permeability of the core can be read on the y-axis as approximately 60. If one replaces the core with a geometrically identical core made of a material with an initial permeability of 10000, the apparent permeability will still be approximately 60.

The core of the induction magnetometer can also be permeability limited. For example, suppose that we have a core with an initial permeability of 1000 and a length-to-diameter ratio of 200; the apparent permeability will be approximately 1000. If the same material is used to make a core that has a length-to-diameter ratio of 500, the apparent permeability will remain at approximately 1000.

Figure 6:
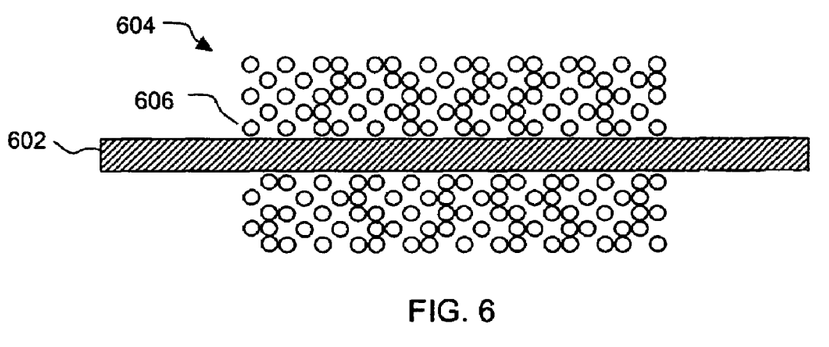
FIG. 6 is a cross-section view of a scramble-wound embodiment of an elemental induction magnetometer of the present invention.

FIG. 6 illustrates a cross-section view of a simplified elemental induction magnetometer of the present invention. The figure is not to scale, but illustrates the core 602 having larger length-to-diameter ratio when compared with FIG. 2 illustrating a simplified conventional induction magnetometer. The coil 604 is scramble-wound such that the individual turns of wire 606 are wound in a pseudo-random pattern. The turns of wire are wound spaced apart in order to reduce the distributed capacitance between the individual turns. Thus, each layer of turns is not completely filled before the next layer is wound. Capacitance is of concern because when combined with the inductance of the coil, it causes self-resonance. This resonance limits the usable bandwidth and therefore is usually avoided. From experiments it was discovered that the capacitance of the induction magnetometer becomes stable once a large number of turns have been spooled onto the core. Given the relative stability of capacitance for a large number of turns, the parameter which has the most influence on the frequency of self-resonance is the inductance. Although the spacing introduced decreases the capacitance, it increases the length of wire required to make the same number of turns and thus increases the weight and the resistance of the winding.

Figure 7:
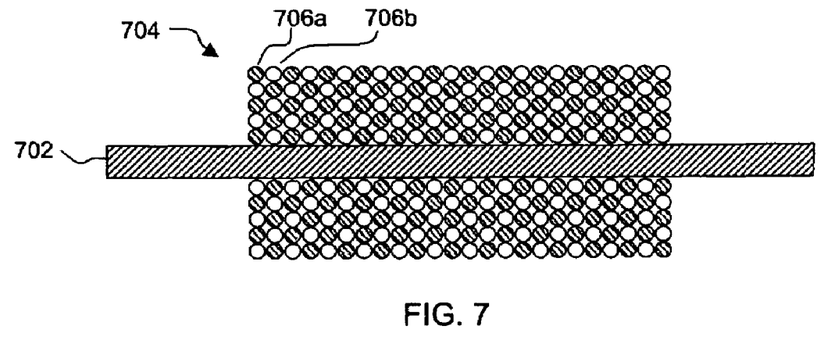
FIG. 7 is a cross-section view of a multifilar-wound embodiment of an elemental induction magnetometer of the present invention.

FIG. 7 illustrates a cross-section view of another embodiment of a simplified elemental induction magnetometer of the present invention. In this embodiment, the capacitance of the coil 704 is reduced by using a multi-filar winding such that two individual wires 706a, 706b are wound on the core 702 simultaneously. The two resulting interleaved coils are then connected in series. The use of two wires is by way of example only. Multi-filar windings of more than two wires are contemplated as well.

Figure 8:
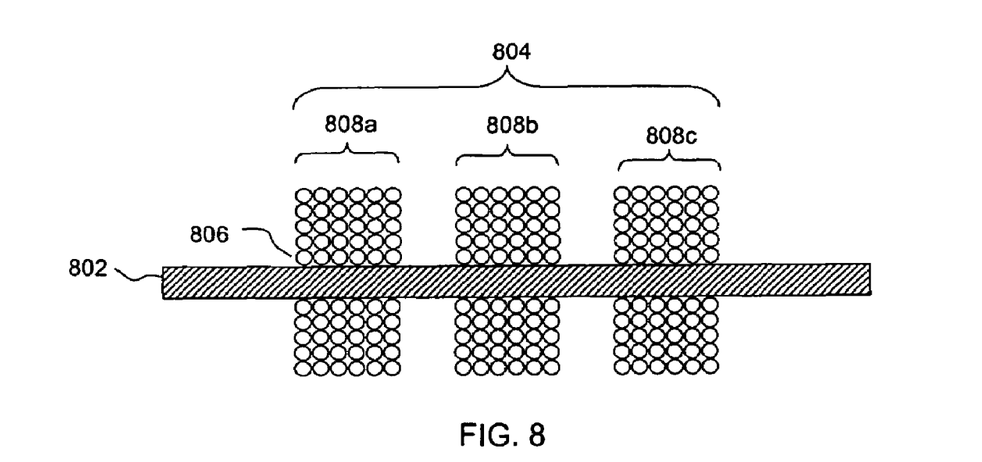
FIG. 8 is a cross-section view of a multibobbin-wound embodiment of an elemental induction magnetometer of the present invention.

Another possible way of reducing winding capacitance in an elemental induction magnetometer is illustrated in the multibobbin wound arrangement of FIG. 8 where the core 802 has a coil 804 made by winding a single winding wire 806 into multiple separate coils or bobbins 808a, 808b, 808c onto the core 802.

Figure 9:
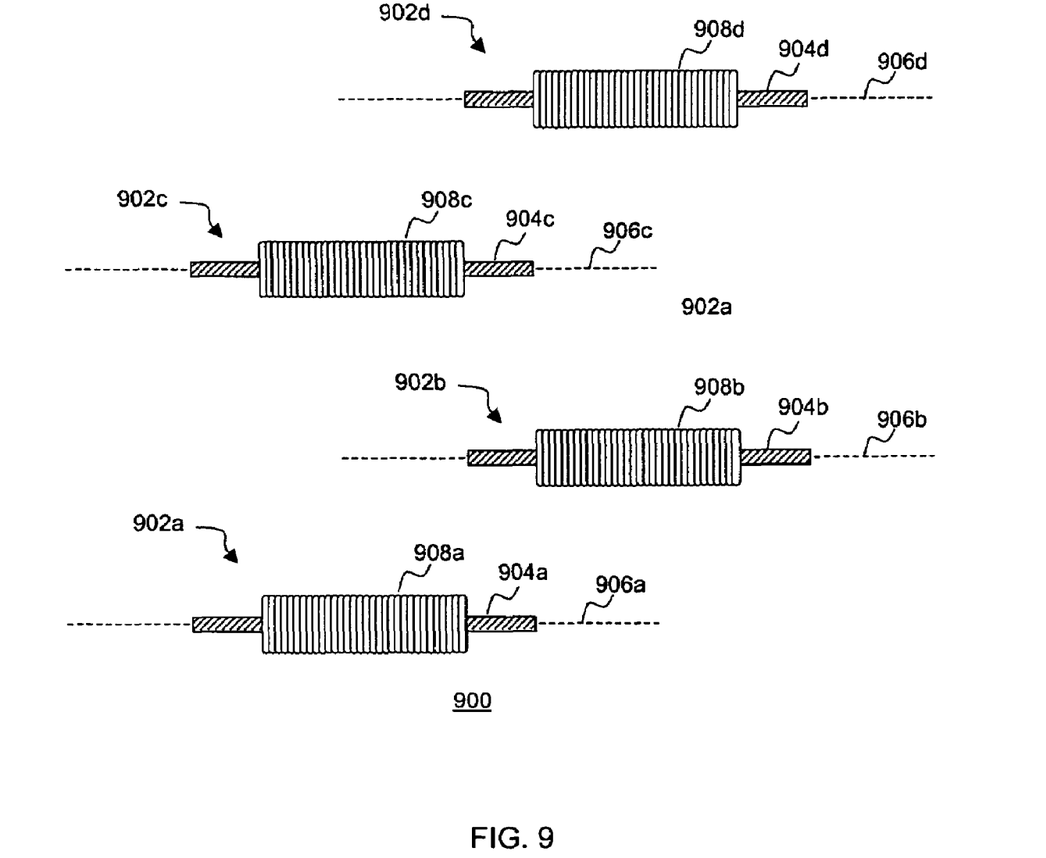
FIG. 9 is an oblique isometric view of an embodiment of an induction magnetometer array of the present invention.

FIG. 9 is an oblique isometric view of an embodiment of an induction magnetometer array 900 of the present invention. Instead of a single conventional induction magnetometer, four elemental induction magnetometers 902a, 902b, 902c, 902d are used. The total cross-sectional area of the four permeable cores 904a, 904b, 904c, 904d compares to that of a single-core conventional induction magnetometer. The total number of windings on the four permeable cores 904a, 904b, 904c, 904d compares to the number of windings of conventional induction magnetometer. The longitudinal axes 906a, 906b, 906c, 906d of the cores 904a, 904b, 904c, 904d are mutually parallel. That is, they are all parallel to each other. The coils 908a, 908b, 908c, 908d are wound around smaller diameter cores than a comparable conventional induction magnetometer of the same or similar length and therefore use less wire for the same total number of windings.

When the elemental induction magnetometers 902a, 902b, 902c, 902d are spaced properly, their mutual inductance is minimal and thus the total inductance of the induction magnetometer array is the simple algebraic sum of inductance of the respective elemental induction magnetometers. Closer spacing causes mutual inductance and thus the inductance is higher than would be expected by simple algebraic sum. If the spacing is increased, the volume needed to house the structure becomes cumbersome.

The minimum spacing to limit the mutual inductance of the elemental induction magnetometers was found through simulations, using Microwave Studio®. These simulations revealed that parallel elemental induction magnetometers should be spaced one core length from each other. The smaller inductance for the induction magnetometer array means that it will self resonate at higher frequencies thus allowing larger bandwidths.

The induction magnetometer array 900 can have the elemental induction magnetometers 902a, 902b, 902c, 902d arranged in a variety of configurations. They can be arranged so that the longitudinal axes 906a, 906b, 906c, 906d coincide, so that they are in-line, or they can be arranged so that longitudinal axes 906a, 906b, 906c, 906d are in a plane. In the preferred embodiment as illustrated in FIG. 9, each longitudinal axis 906a, 906b, 906c, 906d corresponds to an edge of a rectangular parallelepiped. This allows for the construction of a compact three-axis orthogonal induction magnetometer as will be described with reference to FIG. 10.

Figure 10:
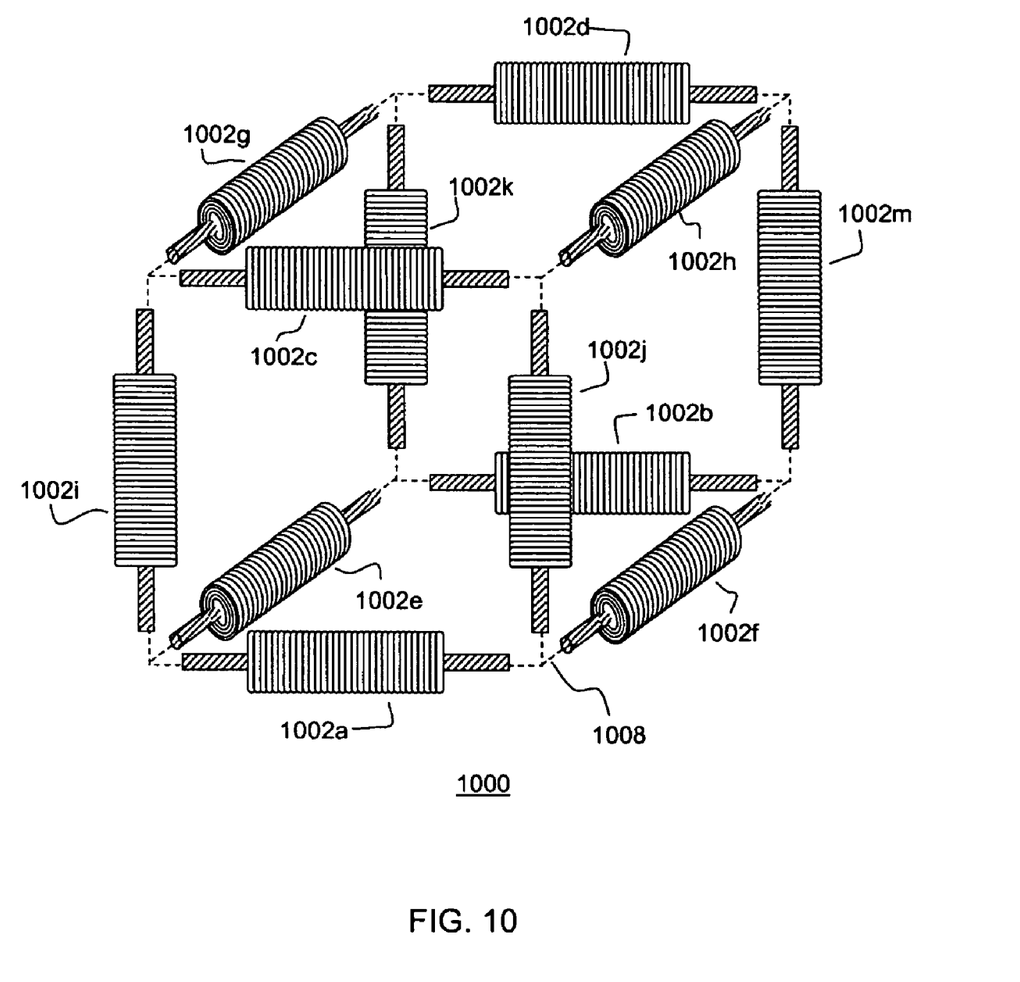
FIG. 10 is an oblique isometric view of an embodiment of an orthogonal induction magnetometer of the present invention.

FIG. 10 is an oblique isometric view of an embodiment of a three-axis orthogonal induction magnetometer 1000 of the present invention. The orthogonal induction magnetometer 1000 is composed of three induction magnetometer arrays as illustrated in FIG. 9, assembled in an orthogonal fashion. Thus elemental induction magnetometers 1002a, 1002b, 1002c, 1002d comprise a first array oriented horizontally in FIG. 10; elemental induction magnetometers 1002e, 1002f, 1002g, 1002h comprise a second array oriented obliquely in FIG. 10; and elemental induction magnetometers 1002i, 1002j, 1002k, 1002m comprise a third array oriented vertically. Each of the three arrays described are thus arranged to have mutually orthogonal axes with respect to each other. The longitudinal axes of the cores of the elemental induction magnetometers 1002a, 1002b, 1002c, 1002d, 1002e, 1002f, 1002g, 1002h, 1002i, 1002j, 1002k, 1002m correspond to edges of a rectangular parallelepiped 1008. In a preferred embodiment, the rectangular parallelepiped is a cube. This configuration provides a very compact arrangement of magnetometer sensors having low mutual inductance, high sensitivity, high signal-to-noise ratio, and is well suited for use in airborne geophysical exploration using airborne transient electromagnetic methods.

Figure 11:
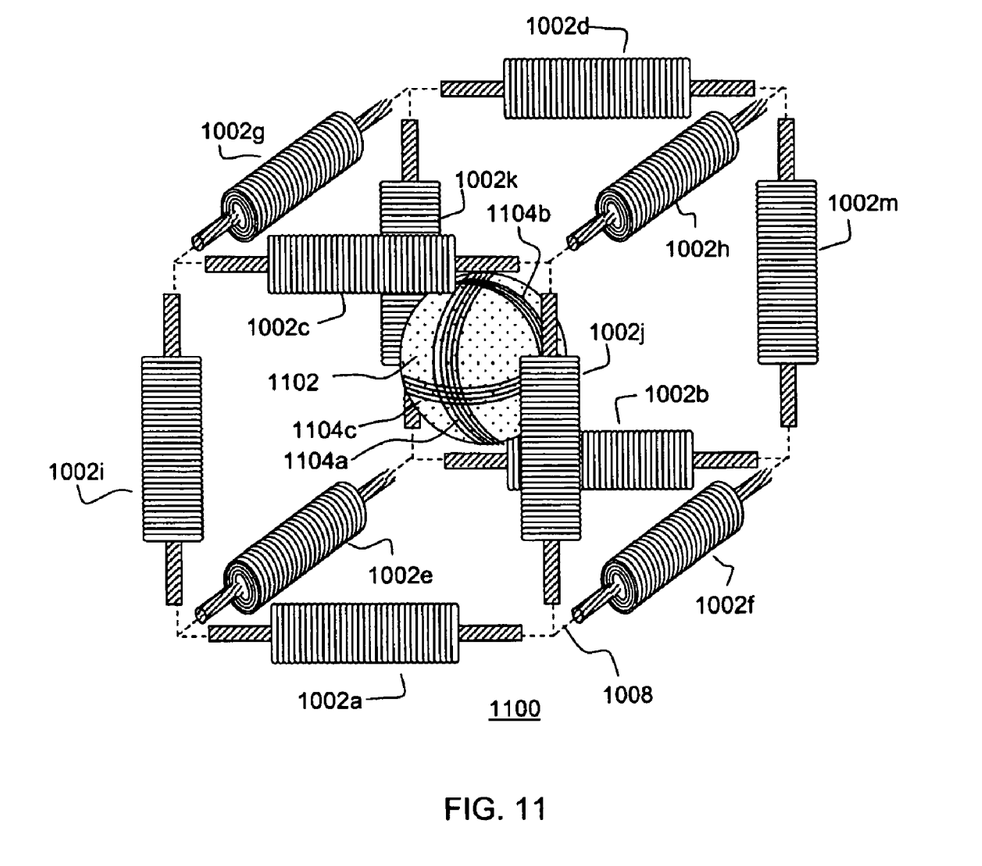
FIG. 11 is an oblique isometric view of an embodiment of an orthogonal induction magnetometer with a calibration source, of the present invention.

In order to calibrate an orthogonal induction magnetometer, it is necessary to have a known magnetic field. The overall performance of the orthogonal induction magnetometer can be evaluated by using the arrangement of FIG. 11, which illustrates an oblique isometric view of an embodiment of a three-axis orthogonal induction magnetometer 1100 with a calibration source, of the present invention. This embodiment is identical to the three axis orthogonal induction magnetometer 1000 of FIG. 10, with the addition of a calibration field source 1102 adapted to generate a magnetic field for calibrating the magnetometer 1000. In the embodiment of FIG. 11, the calibration field source 1102 comprises transmitting loops 1104a, 1104b, 1104c. Each of the transmitting loops is located at the center of the parallelepiped 1008, and can be used to calibrate the elemental induction magnetometers having parallel axes. The axis of symmetry (horizontal in FIG. 11) of transmitting loop 1104a, is parallel to the longitudinal axes of the cores of the elemental induction magnetometers 1002a, 1002b, 1002c, 1002d. The axis of symmetry (oblique in FIG. 11) of transmitting loop 1104*b* is parallel to the longitudinal axes of the cores of the elemental induction magnetometers 1002*e*, 1002*f*, 1002*g*, 1002*h*. The axis of symmetry (vertical in FIG. 11) of transmitting loop 1104*c* is parallel to the longitudinal axes of the cores of the elemental induction magnetometers 1002*i*, 1002*j*, 1002*k*, 1002*m*. Because the calibration field sources (transmitting loops 1104*a*, 1104*b*, 1104*c*) are located symmetrically with respect to the magnetometers having the same orientation, and since they are rigidly fixed with respect to the magnetometers, they can provide an accurate and convenient means for calibrating the orthogonal induction magnetometer. Having a known calibration reference on-board provides an increase in the reliability of the overall system. The addition of the calibration field source allows for frequent calibration and system sanity checks. These checks can even be done in flight when the system has reached the end of a survey line and is turning around. If the system malfunctions, it will be detected before the next line is flown, saving a lot of time and money to the survey company.

The calibration field source 1102 can be configured as a sphere with the orthogonal transmitting loops 1104*a*, 1104*b*, 1104*c* wound around the sphere. Other arrangements providing a magnetic field symmetric to the elemental induction magnetometers are contemplated to fall within the scope of the present invention.

The calibration arrangement of FIG. 11 resembles the way in which the orthogonal induction magnetometer is to be used. Since the frequencies in use are very low, their wavelengths are of gigantic proportions measuring several million meters. These long wavelengths mean that the orthogonal induction magnetometer will be in the near field region of both the primary field from the transmitter and the secondary field from the conductive target. Although the magnetic field is varying with time, it can be modeled accurately by a static magnetic field. If the transmitter loop and the receiver loops are coplanar and separated by at least seven times the radius of the transmitter loop, the field strength at a distance R is well approximated by $$H_z = -\frac{INA}{4\pi R^3} \quad (1)$$

where I is the current in the loop, N is the number of turns in the transmitter loop, A is the area of the transmitter loop, R is the distance at which the field is to be measured. In order to obtain accurate calibration with this method, the alignment of the orthogonal induction magnetometer and the transmitter must be perfect and the distance between the two must be known accurately. Care should also be taken to limit the amount of conductors and permeable materials placed in the vicinity of the test setup since they will distort the field and lead to improper calibration.

Given unlimited space, weight and financial means, one could build very large CIMs such as the ones used for micro-pulsation research at the Dallas Geomagnetic Center. These coils allow measurements of effects of magneto-hydrodynamic waves on low frequency ($10^{-4}$-$10^0$ Hz) fluctuations in the Earth's magnetic field. Unfortunately, space, weight and budget all have limits imposed by physical realities, such as gravity. The six foot long Mu-Metal® cores used are much longer and heavier than could ever be accommodated by the helicopters available. Economics play a major role since the price of the helicopter rental constitutes a large part of the survey cost. The heavier the load, the larger the helicopter and the greater the expense.

The shape of the core will influence the length of wire needed to complete the number of turns, and thus the resistance of the magnetometer, but in order to keep things simple, a first aspect of the optimization is done only on the variables directly related to the core. The optimization is thus going to be concerned with the result of the Area-Permeability product. An increase in either the area or the permeability yields an increase in the sensitivity of the induction magnetometer. It is important to note that materials are limited by their initial permeability, thus even if a ferrite with initial permeability of 6500 was to have a length-to-diameter ratio of 1000 its permeability would never reach 300000, but would be limited to 6500.

Figure 12:
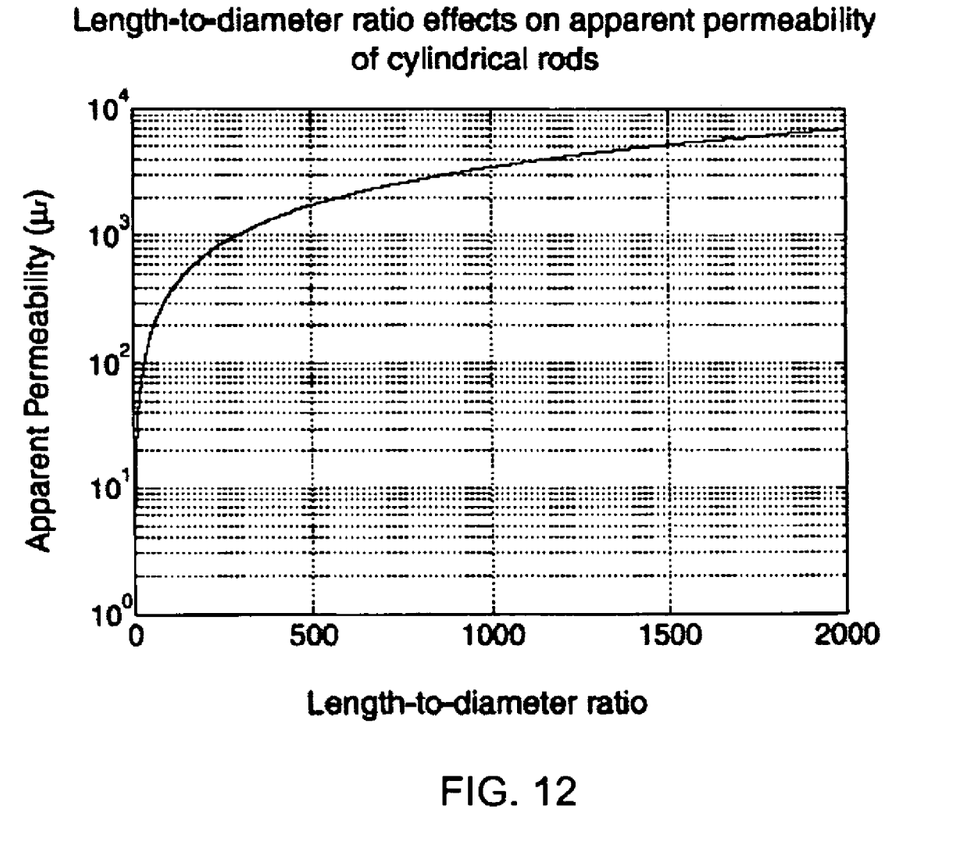
FIG. 12 is a detailed graph illustrating the impact of the length-to-diameter ratio on the apparent permeability.
Figure 13A:
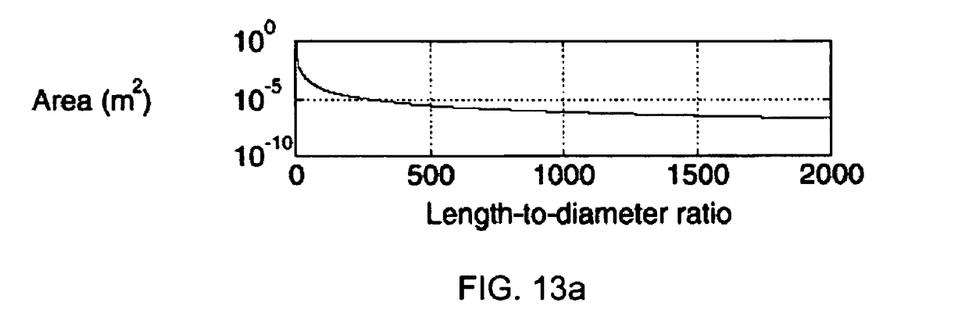
FIG. 13a is a graph illustrating the effect of reducing the diameter on the cross-sectional area of a permeable core.
Figure 13B:
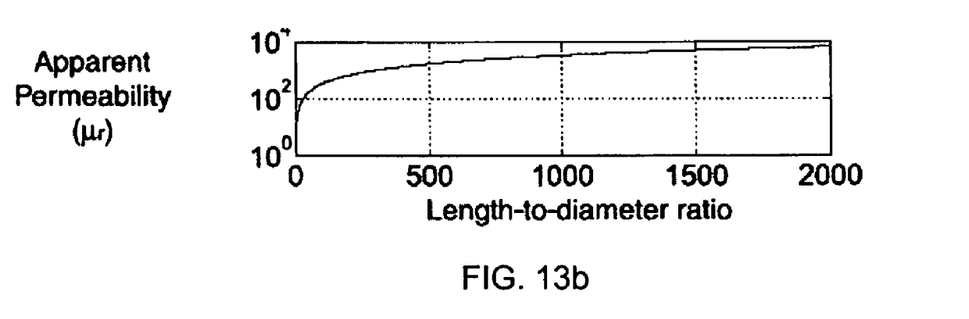
FIG. 13b is a graph illustrating the effect of reducing the diameter on the apparent permeability of a permeable core.

For ATEM there are usually limits imposed on the overall length of a CIM. For a CIM designed to meet these limits, the only way to increase the length-to-diameter ratio is to make the diameter smaller. FIG. 12 illustrates the impact this has on the apparent permeability of the core. Assuming that core length is kept constant, FIG. 13*b* illustrates that by decreasing the diameter of the core the apparent permeability increases. But FIG. 13*a* illustrates that the area decreases. The impact on the area-permeability product can be seen in FIG. 13*c*.

Figure 13C:
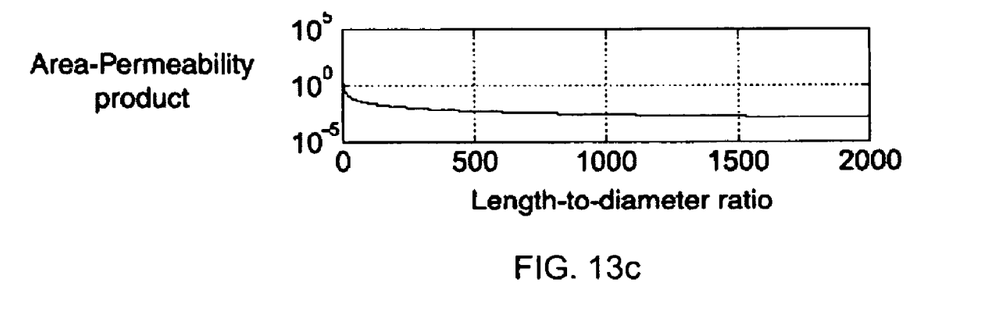
FIG. 13c is a graph illustrating the effect of reducing the diameter on the area-permeability product of a permeable core.

FIGS. 13*a*, 13*b* and 13*c* indicate that it would seem advantageous to increase the area of the core rather than its length. From Faraday's law of electromagnetic induction, this also appears to make sense since a larger area will enclose more flux. The disadvantage with this approach is that by increasing the area, the weight of the core and its size rapidly becomes a problem. It should be kept in mind that a primary advantage of using a permeable core is to concentrate the flux and make the sensor lighter and more portable than an air cored CIM.

Coil length relative to core length affects the efficiency of an inductive magnetometer design. A coil which is short in comparison to the length of the core will have more flux passing through it than if it is distributed over a longer part of the core. This however does not guarantee the magnetometer with the highest signal-to-noise ratio (SNR). The output voltage is determined by the number of turns multiplied by the time derivative of the flux which passes through the winding. When a short coil is constructed around the center of the core, and a large number of turns is required, the radius of the turn increases rapidly. This means that more copper is required to make the same amount of turns which makes the winding heavier and the increased wire length also makes the resistance higher. A higher resistance in turns gives a higher amount of thermal noise, and thus the gains obtained by wrapping the center of the core may not be realized in practice. Experimental testing has shown that the optimal distribution of the winding is between 60% and 70% of the length of the core.

High permeability cores are generally not easily acquired. The types of ferrites or permeable alloys that compose the cores of induction magnetometers are not usually available as a standard product and thus must be specially ordered from the manufacturers. Even then, the dimensions available are governed by physical properties of the material and the tooling available. Even if an optimal design can be found in theory, it may not be affordable to pursue it in practice given the limitations of the tooling.

MN60 is a ferrite made from iron, manganese and zinc. This ferrite has the appearance of a dark ceramic material and is very brittle. The initial permeability of MN60 is about 6500, it has a dc-volume resistivity of 200 ohms-cm and it has a density of 4.3 g/cm3.

MN60 ferrite is usually acquired in the form of rods having a diameter of 5/8 of an inch and 8 inches long. Three of these rods can be glued together with epoxy in order to obtain a core measuring 24 inches. The length-to-diameter ratio of the resulting core is therefore 38.4. The core could be made lighter by reducing the diameter of the core, however due to the brittle nature of the MN60 ferrite, the resulting induction magnetometer might be too fragile to be used in the field. The core can be placed in a lathe equipped with a counting mechanism and copper wire can be wound onto the central 60% of the core. Experimental testing has revealed that the capacitance of an induction magnetometer so constructed increased to about 300 pF until about 1000 turns were spooled onto the core and remained relatively constant even when up to 4000 turns were spooled onto a ferrite sore.

The embodiment(s) of the invention described above is(are) intended to be exemplary only. The scope of the invention is therefore intended to be limited solely by the scope of the appended claims.

We claim:

1. An induction magnetometer array suitable for airborne geophysical exploration, said magnetometer array comprising:
    four elemental induction magnetometers;
    each said elemental induction magnetometer comprising:
        a permeable core; and
        a multi-turn coil surrounding at least a portion of said core,
    wherein said cores of said elemental induction magnetometers are arranged such that their longitudinal axes are mutually parallel,
    wherein output signals from said multi-turn coils comprised in said elemental induction magnetometers are aggregated,
    wherein each said permeable core in said elemental induction magnetometers is distinct, and
    wherein each said core of said array is spaced from any other said core of said array by at least the length of a said core.

2. An induction magnetometer array as claimed in claim 1, wherein said longitudinal axis of each said core corresponds to an edge of a parallelepiped.

3. An induction magnetometer array as claimed in claim 2, wherein said parallelepiped is a cube.

4. An induction magnetometer array for airborne geophysical exploration, said magnetometer array comprising:
    a plurality of elemental induction magnetometers;
    each said elemental induction magnetometer comprising:
        a permeable core; and
        a multi-turn coil surrounding at least a portion of said core,
    wherein said cores of said elemental induction magnetometers are arranged such that their longitudinal axes are mutually parallel,
    wherein output signals from said elemental induction magnetometers are aggregated,
    wherein each said core of said array is spaced from any other said core of said array by at least the length of a said core,
    wherein said multi-turn coil covers the central 60% to 80% of the core length, and
    wherein said multi-turn coil comprises multi-bobbin windings.

5. An orthogonal induction magnetometer for airborne geophysical exploration, said orthogonal induction magnetometer comprising:
    a plurality of magnetometer, said magnetometer array comprising:
        a plurality of elemental induction magnetometers;
        each said elemental induction magnetometer comprising:
            a permeable core; and
            a multi-turn coil surrounding at least a portion of said core,
        wherein said cores of said elemental induction magnetometers are arranged such that their longitudinal axes are mutually parallel, and
        wherein output signals from said elemental induction magnetometers are aggregated;
    said magnetometer arrays arranged to have mutually orthogonal longitudinal axes;
    wherein said orthogonal induction magnetometer comprises three said arrays;
    wherein said longitudinal axes of said cores correspond to edges of a rectangular parallelepiped;
    wherein said rectangular parallelepiped is a cube;
    said induction magnetometer further comprising a calibration field source,
    wherein said calibration field source is located within the boundaries of said rectangular parallelepiped, and
    said calibration field source is adapted to generate a magnetic field for calibrating at least one of said magnetometer arrays.

6. An orthogonal induction magnetometer as claimed in claim 5, wherein said calibration field source is located at the center of said rectangular parallelepiped.

7. An induction magnetometer as claimed in claim 6, wherein said calibration field source comprises a plurality of mutually orthogonal windings, and
    each said winding is adapted to generate a magnetic field for calibrating one of said magnetometer arrays.

8. An orthogonal induction magnetometer as claimed in claim 7, wherein said mutually orthogonal windings are surrounding a spherical volume.

9. An orthogonal induction magnetometer for airborne geophysical exploration, said orthogonal induction magnetometer comprising a plurality of magnetometer arrays, each said magnetometer array comprising:
    a plurality of elemental induction magnetometers,
    each said elemental induction magnetometer comprising:
        a permeable core; and
        a multi-turn coil surrounding at least a portion of said core,
    wherein said cores of each said array are arranged such that their longitudinal axes are mutually parallel, and
    output signals from said elemental induction magnetometers are aggregated, and
    wherein said magnetometer arrays are arranged in a mutually orthogonal fashion, and
    said longitudinal axes of said cores correspond to edges of a rectangular parallelepiped,
    said orthogonal induction magnetometer further comprising a calibration field source,
    wherein said calibration field source is located within the boundaries of said rectangular parallelepiped.

* * * * *